United States Patent [19]
Dash et al.

[11] Patent Number: 5,173,439
[45] Date of Patent: Dec. 22, 1992

[54] FORMING WIDE DIELECTRIC-FILLED ISOLATION TRENCHES IN SEMI-CONDUCTORS

[75] Inventors: Somanath Dash; Michael L. Kerbaugh, both of Burlington; Charles W. Koburger, III, Essex; Brian J. Machesney, Burlington, all of Vt.; Nitin B. Parekh, Austin, Tex.

[73] Assignee: International Business Machines Corporation, Armonk, N.Y.

[21] Appl. No.: 679,568

[22] Filed: Apr. 2, 1991

Related U.S. Application Data

[63] Continuation of Ser. No. 427,153, Oct. 25, 1989, abandoned.

[51] Int. Cl.⁵ .............................................. H01L 21/76
[52] U.S. Cl. ...................................... 437/67; 437/203; 437/228
[58] Field of Search ................... 437/62, 67, 69, 70, 437/72, 225, 228, 203; 148/DIG. 50, DIG. 85, DIG. 86

[56] References Cited

U.S. PATENT DOCUMENTS

| | | | |
|---|---|---|---|
| 4,278,987 | 7/1981 | Imaizumi | 357/48 |
| 4,376,672 | 3/1983 | Wang | 156/643 |
| 4,385,975 | 5/1983 | Chu | 204/192 E |
| 4,526,631 | 7/1985 | Silvestri | 148/175 |
| 4,671,851 | 6/1987 | Beyer | 156/645 |
| 4,671,970 | 6/1987 | Keiser | 427/93 |
| 4,836,885 | 6/1989 | Breiten | 156/643 |
| 4,962,069 | 10/1990 | Haskell et al. | 437/228 |

FOREIGN PATENT DOCUMENTS

| | | |
|---|---|---|
| 0300569 | 1/1989 | European Pat. Off. |
| 0341898 | 11/1989 | European Pat. Off. |
| 2599892 | 12/1987 | France |
| 59-13342 | 1/1984 | Japan |
| 59-175138 | 10/1984 | Japan |
| 59-177941 | 10/1984 | Japan |
| 59-193044 | 11/1984 | Japan |
| 60-236244 | 11/1985 | Japan |
| 59-117233 | 7/1989 | Japan |

OTHER PUBLICATIONS

IBM Technical Disclosure Bull, vol. 30, No. 2 (Jul. 1987) pp. 539–540.

*Primary Examiner*—G. Fourson
*Attorney, Agent, or Firm*—Calfee, Halter & Griswold

[57] ABSTRACT

A method of forming a planarized dielectric filled wide shallow trench in a semi-conductor substrate is provided. A layer of etch stop such as $Si_3N_4$ is deposited onto the semi-conductor substrate, and wide trenches are formed through the $Si_3N_4$ into the substrate by conventional RIE. The surface of the substrate including the trenches have formed thereon a $SiO_2$ coating, conforming to the surface of the substrate. A layer of etch resistant material such as polysilicon is deposited onto the $SiO_2$ material. The polysilicon outside the width of the trenches is then removed by chemical-mechanical polishing to expose the $SiO_2$ there below, while leaving the $SiO_2$ above the trenches covered with polysilicon. The exposed $SiO_2$ is then RIE etched down to the $Si_3N_4$, leaving a plug of $SiO_2$ capped with the etch resistant polysilicon over each trench. These plugs are then removed by mechanical polishing down to the $Si_3N_4$, to provide a planarized upper surface of $SiO_2$ and $Si_3N_4$ on the top of the substrate. The invention also is useful in forming planarized surfaces on substrates having trenches filled with conductive material.

14 Claims, 1 Drawing Sheet

FORMING WIDE DIELECTRIC-FILLED ISOLATION TRENCHES IN SEMI-CONDUCTORS

This is a continuation of copending application Ser. No. 07/427,153 filed on Oct. 25, 1989, now abandoned.

BACKGROUND OF THE INVENTION

This invention relates generally to the manufacture of semi-conductor devices. More particularly, the invention relates to a method of forming planarized wide filled trenches in the surface of a semi-conductor substrate, especially a silicon wafer, particularly filled with dielectric material, although the invention also can be used to form trenches filled with conductive material.

In the art of large-scale integrated chips, a large number of surface conductors are required for distribution of operating voltages and currents and digital signals between devices. Although surface conductors are insulated from the semi-conductor substrate upon which they are formed, a certain amount of capacitive coupling is present between the insulated conductor and the substrate through the insulating material. This capacitive coupling degrades the signal carried by the surface conductors.

While this capacitive coupling can be minimized by increasing the thickness of the dielectric material separating the conductors and the substrate, it is more desirable to recess the dielectric material below the surface of the substrate and maintain the planarity of the substrate rather than add the dielectric material onto the surface of the substrate. This is accomplished by forming shallow trenches in the surface of the substrate, and filling the trenches with dielectric material, normally silicon dioxide. These trenches may be either narrow trenches (i.e., less than about one micron in width, and more typically about 0.5 microns) and wide trenches (i.e., those wider than about one micron).

It is relatively simple to maintain planarity when forming dielectric filled narrow trenches. However, problems of maintaining planarity with the semi-conductor substrate and the dielectric material are presented with wide trenches because of the conformal nature of the deposition of the dielectric and especially silicon dioxide in the wide trenches.

There have been several prior art proposals for solving these problems of forming planarized dielectric filled wide trenches. One such proposal, described in U.S. Pat. No. 4,385,975 assigned to the assignee of this invention, utilizes a step in the process of depositing a photoresist material through a mask over the dielectric material contained in the trenches *before* planarization. The dielectric material is then reactive ion etched (RIE) with the photoresist masking the underlying material from etching, thus resulting in a relatively planer structure. U.S. Pat. No. 4,671,970 also utilizes a photoresist as a mask for reactive ion etching of dielectric material. These teachings of masking, while somewhat effective, nevertheless have certain drawbacks. They require extra masking and photolithographic steps, which adds two processing steps, and more importantly create significant problems of alignment; i.e., the mask must be perfectly aligned to deposit the photoresist exactly within the conformal or trough portion of the deposited dielectric material to be utilized to mask just that dielectric material desired and to expose the rest.

U.S. Pat. No. 4,278,987 shows a somewhat different technique for filling trenches, not with dielectric material, but with a semi-conductor material having a different characteristic than the base substrate material. This also uses a masking process.

U.S. application Ser. No. 189,863, filed May 3, 1988, owned by the assignee of this invention, discloses another technique for planarizing wide dielectric filled isolation trenches.

One of the principal objects of this invention is to provide an improved method of forming dielectric filled wide trenches in a semi-conductor substrate which is self-aligning and has resultant good planarization.

SUMMARY OF THE INVENTION

A method or process for forming a wide, shallow filled trench on the surface of a semi-conductor substrate is provided, and in particular a dielectric filled trench. The process includes forming a wide, shallow trench in the surface of the semi-conductor substrate followed by conformally depositing a layer of dielectric material on the surface of the substrates including in the trench. A layer of etch-resistant material is deposited on the layer of the dielectric material. Portions of the etch resistant material outside the width of the trench are selectively removed, preferably by chemical-mechanical polishing, such that the remaining portions of the etch resistant material reside within the width of the trench. Following this, a dielectric plug is formed above the trench by etching the layer of dielectric material which is not covered by the etch resistant material down to the top of the trench. Finally, the dielectric plug is removed, preferably by polishing, to obtain a dielectric filled trench, having an upper surface in substantial planarity with the upper surface of the substrate. This invention also can be used to fill and planarize trenches with conductive material.

DESCRIPTION OF THE PREFERRED EMBODIMENTS

Figure 1:
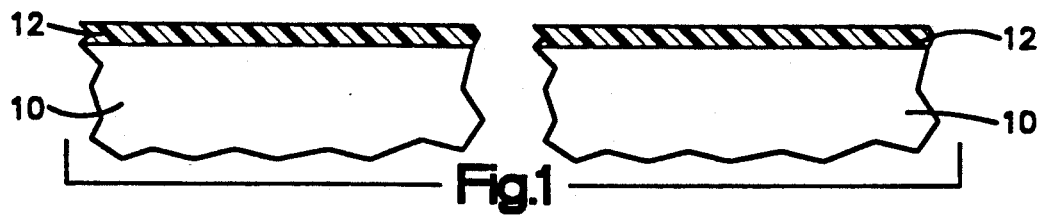
FIGS. 1 through 6 are cross-sectional views, somewhat diagrammatic, showing successive stages of processing of a semi-conductor having wide and narrow shallow trenches formed, filled with dielectric material and planarized according to this invention.
Figure 2:
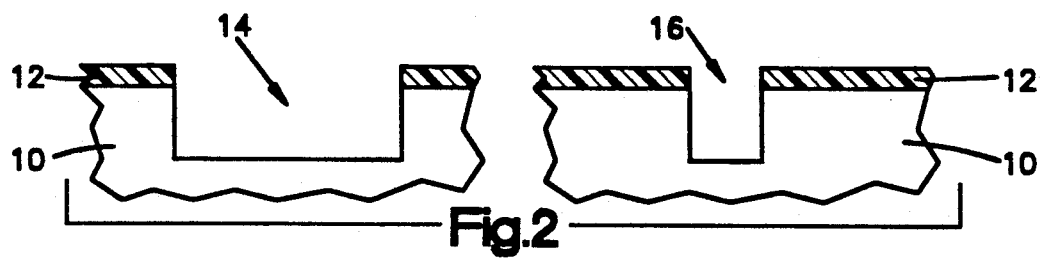

Referring now to the drawings, and for the present, FIG. 1, there is shown a silicon semi-conductor substrate 10 having an etch stop coating of silicon nitride ($Si_3N_4$) 12 deposited thereon. The silicon nitride is typically about 1000 Å thick and can be deposited by conventional means such as by chemical vapor deposition (CVD) from $SiH_2Cl_2 + NH_3$ at 400 mTorr, at 770° C. The silicon nitride is then patterned by conventional photoresist techniques to reveal underlying openings where both wide and narrow trenches are to be formed. Two such trenches 14 and 16 are shown in FIG. 2 formed in substrate 10 although it is to be understood that normally many such trenches are formed. The trench 14 is a wide trench, typically wider than about one micron, and the trench 16 is a narrow trench, less than one micron wide and typically about 0.5 microns wide. These can be formed by conventional RIE etching in a well-known manner, such as, for example, in a plasma of $NF_3 + Ar$ at 10 mTorr and 0.1–0.2 W/cm$^2$, utilizing the photoresist as a mask material which is a well-known practice in the art. Other processes, also which are well-known, may be used to form the trenches 14 and 16.

As indicated above, the present invention is especially useful for forming dielectric filled wide trenches; however, FIGS. 1 through 6 illustrate how the present invention can be used on substrates which contain narrow trenches as well as wide trenches.

Figure 3:
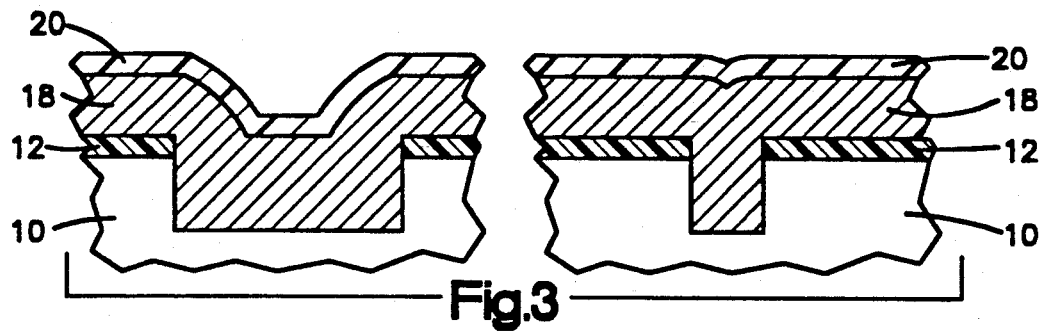

As shown in FIG. 3, a layer of silicon dioxide ($SiO_2$) 18 is formed over the surface of the substrate, including both the wide and narrow trenches 14 and 16. Preferably the $SiO_2$ layer is deposited using well-known CVD processes which typically includes vapor deposition in tetraethylorthosilane (TEOS) at 650 mTorr at 715° C. Of course, other processes could be used. The thickness of the CVD $SiO_2$ layer is approximately equal to the total depth of the trench so that the top of the $SiO_2$ layer in the trench 14 is approximately even with the top layer of the silicon substrate. This is typically about 6000 Å in thickness, although this can vary greatly with different substrates, depending upon the utilization of the substrates for forming devices and the type of conductors which are to be formed on the substrate.

On top of the silicon dioxide layer 18 is formed a thin layer of polysilicon 20 which typically is about 1000 Å thick. This polysilicon can be deposited in any conventional manner, a preferred method being CVD in $SiH_4 + H_2$ at 400 mTorr at 620° C. This resultant structure is shown in FIG. 3. This structure is then subjected to a chemical-mechanical polish to remove just that portion of the polysilicon 20 which is located outside the confines of the trench 14. In the preferred polishing technique the substrate is mounted onto a flat circular holder which maintains the exposed surface of the polysilicon 20 is contact with a rotating polyurethane pad. The pad is wetted with a slurry of an abrasive material in a basic aqueous solution, such as $SiO_2$, plus aluminum oxide ($Al_2O_3$) and tetramethylammonium hydroxide (TMAH). As the polyurethane pad rotates against the surface of the exposed polysilicon, the chemicals react with the very outer-most surface of the polysilicon 20 to loosen it from the polysilicon which underlies it. The mechanical or abrasive action of the $SiO_2$ then removes this loosened surface wherever it contacts it. Such chemical-mechanical polishing is well-known in the art. This is a continuous process in that a continuous reaction occurs at the outer surface with the chemicals for loosening this layer and those loosened portions of the polysilicon are removed by the abrasive action of the $SiO_2$.

Figure 4:
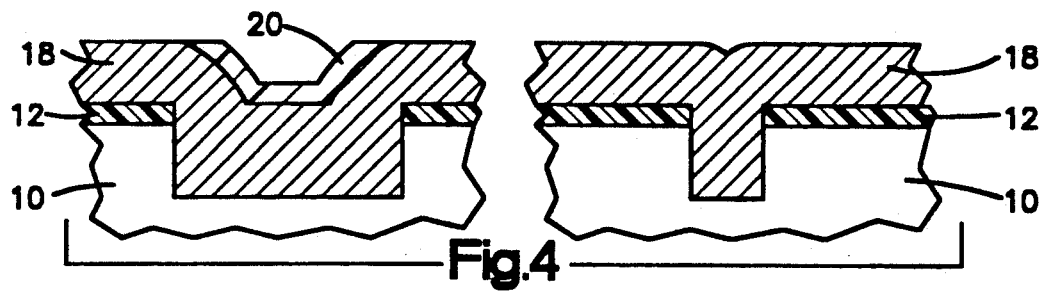
Figure 5:
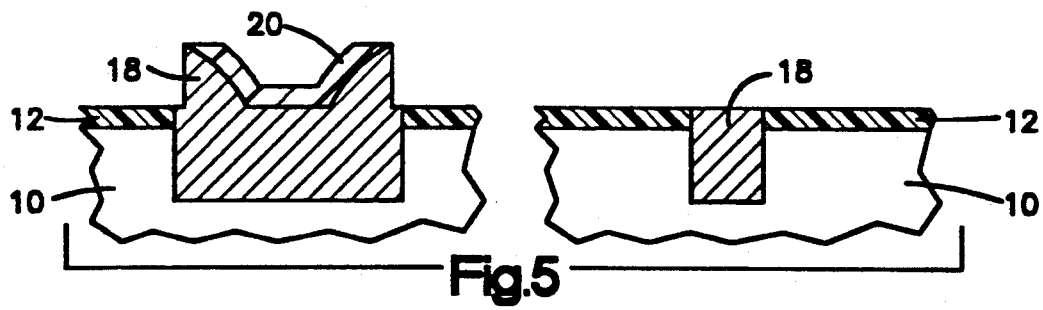
Figure 6:
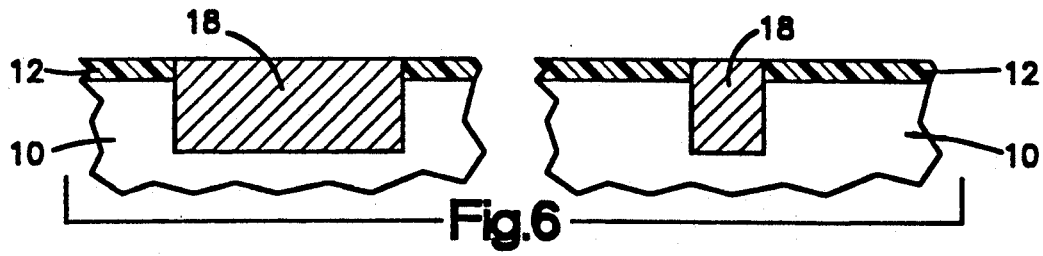

The chemical-mechanical polishing continues until all of the polysilicon that lies outside of the boundaries of the trench 14 has been removed as shown in FIG. 4. Coincidentally it can be seen that actually all of the polysilicon has been removed from the surface of the dielectric 18, filling the narrow trench 16. This, however, is not a problem because of the narrowness of the trench 16, and there is very little conformality which is indicated by the small indentation shown thereabove and is not significant.

The material shown in FIG. 4 is then anisotropically etched by reactive ion etching (RIE). Typically this can be done in a $CHF_3 + CO_2$ atmosphere at 0.1–0.2 W/CM$^2$ and 40 mTorr. This RIE is reactive with the $SiO_2$ material 18 but is not reactive with the polysilicon material 20. Thus, the $SiO_2$ material not masked by the polysilicon material 20 is removed with the silicon nitride layer 12 acting as an etch stop in a well-known manner. This will result in the structure shown in FIG. 5 in which the underlying silicon nitride 12 has been revealed on both sides of the wide trench 14 and on both sides of the narrow trench 16. Also, it should be noted that with respect to the narrow trench 16, since there was no polysilicon material overlying the silicon dioxide in the trench 16, that the etch was also reacting with the $SiO_2$ overlying the trench 16 to provide a planarized surface of the dielectric material 18 with respect to the silicon nitride 12. However, with respect to the material overlying the wide trench 14, a plug of material is left which comprises the $SiO_2$ material underlying the polysilicon 20. This plug of material extends significantly above the planarized level of the silicon nitride 12, thus providing essentially a planarized surface over all of the substrate, except over any trenches where there are these plugs of material.

The entire wafer shown in FIG. 5 is then again chemically-mechanically polished using a silica slurry in basic aqueous solution and polished against a rotating polyurethane disk. This polishing step will remove the plugs of material which are above the wide trenches 14 resulting in a final structure shown in FIG. 6. The silicon nitride 12 acts as the end point for the polishing so that the entire surface of the wafer which includes both wide and narrow trenches filled with silicon dioxide are essentially planarized and hence ready for further processing such as the formation of the conductor patterns on the surface.

Several modifications can be made to the process. For example, a thin (50 nm) layer of polysilicon can be deposited over the silicon nitride layer 12. This will improve the selectivity of the $SiO_2$ RIE, making complete removal thereof more feasible without impairing the uniformity of the silicon nitride etch stop. Also a thin (50 nm) layer of silicon nitride can be deposited over the $SiO_2$ layer 18 before the deposition of the polysilicon layer 20. This will help prevent reduction of the $SiO_2$ layer during the first chemical-mechanical polishing step for the remaining polysilicon layer 20 overlying the trenches 18.

It is also contemplated that similar process steps can be used to form planarized surfaces wherein trenches are filled with conductive materials rather than dielectric material. In such case, the masking materials and etch reagents and conditions are selected to provide the selectivity required.

While several embodiments of the present invention have been shown and described, various adaptions and modifications can be made without departing from the scope of the invention as defined in the appended claims.

What is claimed is:

1. A process for forming a wide dielectric-filled isolation trench in the surface of a semi-conductor substrate comprising the steps of:

forming a wide trench in the surface of the substrate;

conformally forming a layer of dielectric material over the surface of the substrate including in said trench the top surface of which layer of dielectric material extends above the plane of the surface of the substrate;

conformally forming a layer of etch resistant material on said layer of dielectric material which etch resistant material will mask said dielectric material from reactive ion etching;

selectively removing only those portions of said etch resistant material that extend above the surface of the dielectric material by physical polishing and not removing any etch resistant material disposed below the surface of said dielectric material, such that the only remaining portion of the etch resistant material resides within the width of said trench;

forming a dielectric plug above said trench comprising the remaining etch resistant material overlying dielectric material by anisotropically reactive ion etching said layer of dielectric material which is not masked by said etch resistant material down to the top of said trench; and removing said dielectric plug to obtain a dielectric-filled trench having an upper surface in substantial planarity with the upper surface of said substrate.

2. The invention as defined in claim 1 wherein said dielectric material forms a depression above the wide trench.

3. The invention as defined in claim 1 wherein said etch-resistant material is polysilicon.

4. The invention as defined in claim 3 wherein the selective removal of polysilicon comprises chemical-mechanical polishing.

5. The method of claim 4 wherein the chemical mechanical polishing of the polysilicon is done with a slurry of abrasive material maintained in a basic aqueous solution.

6. The invention as defined in claim 1 wherein said plug material is removed down to the top of the trench by chemical-mechanical polishing.

7. The invention as described in claim 6 wherein a layer of etch stop material is provided on the surface of said semi-conductor substrate at least in the region adjacent said wide trenches, and said layer of dielectric material which is not masked by said etch resistant material is etched down to the etch stop layer.

8. The invention as defined in claim 1 wherein said dielectric material is silicon dioxide.

9. The invention as defined in claim 7 wherein said etch stop material is silicon nitride.

10. The invention as defined in claim 9 wherein a layer of polysilicon is formed between said silicon nitride layer and said layer of dielectric material to provide an etch stop for silicon dioxide removal.

11. The invention as defined in claim 7 wherein a layer of silicon nitride is formed over the dielectric material.

12. A process for forming a filled wide trench in the surface of a substrate comprising the steps of:

forming a wide trench in the surface of the substrate;

conformally forming a layer of filling material on the surface of the substrate including in said trench the top surface of which filling material extends above the plane of the surface of the substrate;

conformally forming a layer of etch-resistant material on said layer of filling material which etch resistant material will mask said filling material from reactive ion etching;

selectively removing only those portions of said etch resistant material that extend above the surface of the filling material by physical polishing and not removing any etch resistant material disposed below the surface of said filling material, such that the only remaining portion of the etch resistant material resides within the width of said trench;

forming a plug above said trench comprising the remaining etch resistant material overlying filling material by anisotropically etching said layer of filling material which is not masked by said etch resistant material down to the top of said trench; and removing said plug to obtain a filled trench having an upper surface in substantial planarity with the upper surface of said substrate.

13. The invention as defined in claim 12 wherein said filling material is a conductive material.

14. The invention as defined in claim 12 wherein said filling material is a dielectric material.

* * * * *

UNITED STATES PATENT AND TRADEMARK OFFICE
CERTIFICATE OF CORRECTION

PATENT NO. : 5,173,439
DATED : Dec. 22, 1992
INVENTOR(S) : Dash, et al.

It is certified that error appears in the above-identified patent and that said Letters Patent is hereby corrected as shown below:

Column 5, line 33 change "trenches, and" to --trench, and--

Signed and Sealed this

Second Day of November, 1993

Attest:

BRUCE LEHMAN

Attesting Officer     Commissioner of Patents and Trademarks